United States Patent
Fujita et al.

(10) Patent No.: US 8,193,554 B2
(45) Date of Patent: Jun. 5, 2012

(54) OPTICAL MEMBER HAVING PHOTOCURABLE RESIN AND METHOD FOR MANUFACTURING THE OPTICAL MEMBER

(75) Inventors: Daisuke Fujita, Toyokawa (JP); Yasushi Ishihara, Toyokawa (JP)

(73) Assignee: Konica Minolta Business Technologies, Inc., Chiyoda-Ku, Tokyo (JP)

( * ) Notice: Subject to any disclaimer, the term of this patent is extended or adjusted under 35 U.S.C. 154(b) by 280 days.

(21) Appl. No.: 12/478,828

(22) Filed: Jun. 5, 2009

(65) Prior Publication Data
US 2009/0315041 A1 Dec. 24, 2009

(30) Foreign Application Priority Data
Jun. 18, 2008 (JP) .................................. 2008-158953

(51) Int. Cl.
- H01L 33/00 (2010.01)
- H01L 21/00 (2006.01)
- G02B 26/08 (2006.01)
- G02B 26/10 (2006.01)
- G02B 26/12 (2006.01)
- G11B 7/00 (2006.01)
- H01S 3/08 (2006.01)

(52) U.S. Cl. ............... 257/99; 257/88; 438/26; 438/27; 359/198.1; 369/44.11; 369/44.12; 369/44.13; 369/44.14; 369/44.15; 369/100; 369/112.01; 372/107

(58) Field of Classification Search .................. None
See application file for complete search history.

(56) References Cited

U.S. PATENT DOCUMENTS

| | | | |
|---|---|---|---|
| 5,351,264 A * | 9/1994 | Kato et al. | 372/107 |
| 6,928,100 B2 | 8/2005 | Sato et al. | |
| 7,349,166 B2 * | 3/2008 | Sakai et al. | 359/822 |
| 2002/0075916 A1 | 6/2002 | Sato et al. | |
| 2006/0239169 A1* | 10/2006 | Marumo et al. | 369/100 |
| 2007/0007182 A1* | 1/2007 | Onishi et al. | 209/538 |
| 2007/0183273 A1* | 8/2007 | Arai et al. | 369/44.11 |
| 2008/0316559 A1* | 12/2008 | Nagaoka et al. | 359/198 |

FOREIGN PATENT DOCUMENTS

| | | |
|---|---|---|
| JP | 05-136952 A | 6/1993 |
| JP | 05-273483 A | 10/1993 |
| JP | 09-102652 | 4/1997 |
| JP | 2002-244062 | 8/2002 |

OTHER PUBLICATIONS

Notice of Reason for Refusal issued in the corresponding Japanese Patent Application No. 2008-158953 dated Mar. 30, 2010, and an English Translation thereof.
The First Office Action dated Aug. 5, 2010, issued in the corresponding Chinese Patent Application No. 200910146672.2, and an English Translation thereof.

* cited by examiner

Primary Examiner — Nathan W. Ha
Assistant Examiner — Michael Jung
(74) Attorney, Agent, or Firm — Buchanan Ingersoll & Rooney PC

(57) ABSTRACT

There is provided an optical member 1 in which a fixation member 3 supporting the light emitting member 2 is fixed to a housing 5 supporting a light receiving member 4, so as to have clearances between the fixation member 3 and the housing 5, by photocurable resin 6 bridging the clearances, recesses 7 that adjoin positions where the photocurable resin 6 is deposited, that are opened so as to allow casting of light into the recesses 7, and that are to receive portions of the photocurable resin 6 are formed on the housing 5.

9 Claims, 8 Drawing Sheets

OPTICAL MEMBER HAVING PHOTOCURABLE RESIN AND METHOD FOR MANUFACTURING THE OPTICAL MEMBER

This application is based on application No. 2008-158953 filed in Japan, the contents of which are hereby incorporated by reference.

BACKGROUND OF THE INVENTION

The present invention relates to an optical member and a method for manufacturing of the optical member.

In JP H05-136952 A is disclosed an optical device (optical member) in which a base (fixation member) supporting a semiconductor laser element (light emitting member) and a lens barrel supporting a lens (light receiving member) are fixed to a holder (housing). In JP H05-136952 A, grooves are provided on a surface of the holder that is to be joined to the base, which is bonded by adhesive filled into the grooves.

In JP H05-273483 A, opening holes are formed on joint surfaces of a holder against a lens barrel and a base, and photocurable resin is filled into the holes, so that the lens barrel and the base are fixed to the holder. There is a limit, however, to a depth that light for curing the photocurable resin can reach. In the method for JP H05-273483 A, therefore, insufficient irradiation with the light of photocurable resin on surfaces of the lens barrel and the base may result in insufficient strength of the joining.

This optical member (or optical device) can be manufactured by placing a fixation member which supports a light emitting member or a light receiving member with a clearance between the fixation member and a housing, interposing the photocurable resin into the clearance so as to bridge the clearance, performing fine adjustment of a position of the fixation member within a range that allows maintenance of the bridging state of the photocurable resin, and irradiating the resin with a light to curie the photocurable resin so as to fix relative positions between the light emitting member and the light receiving member.

On condition that a quantity of the adjustment of the fixation member is large in the method, however, the photocurable resin may be flattened so as to have an increased diameter and the light for curing the resin may be hindered from reaching center part thereof. Immediately after the manufacture, it appears that uncured center part of the photocurable resin causes no problem as far as surfaces of the photocurable resin have been cured. The center part of the photocurable resin, however, is gradually cured by influence of natural light or the like after assembly. Common photocurable resin slightly contracts when being cured and thus causes a problem in that the uncured center part of the photocurable resin may result in a slight deviation in a positional relation between the light emitting member and the light receiving member in the optical member with elapse of time.

SUMMARY OF THE INVENTION

In consideration of problems described above, an object of the invention is to provide an optical member in which a light emitting member and light receiving members are positioned on a housing, with relative positions of the members adjusted, so as not to allow change in the positions with elapse of time and to provide a method for manufacturing of the optical member.

In the optical member in accordance with one aspect of the invention, for achievement of the object, the light emitting member for emitting light and the light receiving members for receiving the light emitted from the light emitting member are fixed onto the housing. At least any of the light emitting member and the light receiving members are fixed so as to have clearances between the members and the housing by photocurable resin bridging the clearances. The housing is provided with recesses that are opened so as to receive portions of the photocurable resin and so as to allow casting of light into the recesses.

In fine adjustment of the light emitting member or the light receiving members, in this configuration, spreads of the photocurable resin along surfaces of the housing can be reduced all the better because portions of the photocurable resin enter the recesses. Thus thicknesses of the photocurable resin are reduced in a direction of application of the rays for curing the photocurable resin, so that the photocurable resin can be permeated overall with the rays and can completely be cured. As a result, no later curing of the photocurable resin causes deviation in the relative positions between the light emitting member and the light receiving members.

The method for manufacturing of the optical member in accordance with one aspect of the invention is the method for manufacturing of the optical member in which the light emitting member for emitting light and the light receiving members for receiving the light emitted from the light emitting member are fixed onto the housing, the method including fixing either of the light emitting member and the light receiving members to the housing in advance, and fixing the other of the light emitting member and the light receiving members to the housing by setting of the relative positions between the light emitting member and the light receiving members with check on light receiving conditions of the light receiving members in a state in which the photocurable resin is deposited so as to bridge the clearances between the members and the housing, and by curing of the photocurable resin irradiated with the resin curing rays, wherein the recesses adjoining positions where the photocurable resin is deposited, on a side irradiated with the resin curing rays, are formed on the housing in advance, and wherein the recesses receive portions of the photocurable resin pushed and spread along the housing in the setting of the relative positions between the light emitting member and the light receiving members.

In the fine adjustment of the light emitting member or the light receiving members, in the method, spreads of the photocurable resin along the surfaces of the housing can be reduced all the better because the portions of the photocurable resin enter the recesses. Thus the thicknesses of the photocurable resin are reduced in the direction of application of the rays for curing the photocurable resin, so that the photocurable resin can be permeated overall with the rays and can completely be cured. As a result, later curing of the photocurable resin causes no deviation in the relative positions between the light emitting member and the light receiving members.

In the method for manufacturing of the optical member, the other of the light emitting member and the light receiving members may be supported by a fixation member, and the fixation member may be fixed to the housing by the photocurable resin.

In the method, the fixation member of which a shape can freely be designed is fixed by the photocurable resin. Accordingly, the fixation member can easily be designed so as to be fixed in a position where the photocurable resin can easily be irradiated with the rays and/or so as to be adequately fixed even if the positions of the photocurable resin are deviated.

In the method for manufacturing of the optical member, the positions on the housing where the photocurable resin is deposited may be on two outside surfaces thereof opposed to each other, and the fixation member may have a pair of arms that extend in a direction opposed to the application of the resin curing rays and that are spaced apart from the outside surfaces.

In the method, the photocurable resin is deposited on side surfaces of a part of the housing on which part the light emitting element is mounted and thus there is no danger that the photocurable resin might adhere to the light emitting element in the optical member reduced in size.

In the method for manufacturing of the optical member, the photocurable resin may be deposited on the two outside surfaces so as to have heights not less than a difference between a distance between the pair of arms and a distance between the two outside surfaces, and the fixation member may be placed with respect to the housing from the direction opposed to the application of the resin curing rays.

In the method, reliable adherence of the photocurable resin onto the fixation member results in reliable fixation of the fixation member, and extra photocurable resin adheres to extremities of the arms of the fixation member on a side to be irradiated with the resin curing rays. When the photocurable resin bridging the clearances between the housing and the fixation member is irradiated with the resin curing rays, therefore, the photocurable resin on the extremities of the arms is also irradiated with the resin curing rays and is simultaneously cured, so that such a failure as might be caused by the photocurable resin is prevented.

In the method for manufacturing of the optical member, the arms may be extended to positions generally corresponding to ends of the recesses nearer to the positions where the photocurable resin is deposited.

In the method, the resin curing rays can be applied at a slant into the clearances between the housing and the arms of the fixation member without covering of the arms on the recesses, so that uncured photocurable resin can be prevented from being left in the recesses.

In the method for manufacturing of the optical member, the recesses may be formed so that a wall of each thereof on a side nearer to the position where the photocurable resin is deposited is slanted and so that depths thereof gradually increase.

In the method, the photocurable resin is prone to intrude into the recesses along the slanted walls thereof because of wettability of the photocurable resin with respect to the housing, so that spreads of the photocurable resin in other directions can be reduced.

In the configuration, there are formed the recesses that receive extra portions of the photocurable resin for fixing the light emitting member or the light receiving members to the housing. Thus the photocurable resin can be prevented from spreading and can be cured while being irradiated overall with the resin curing rays. This results in prevention of deviation in the relative positions between the light emitting member and the light receiving members which deviation might be caused by later curing of uncured photocurable resin.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE PREFERRED EMBODIMENTS

Figure 1:
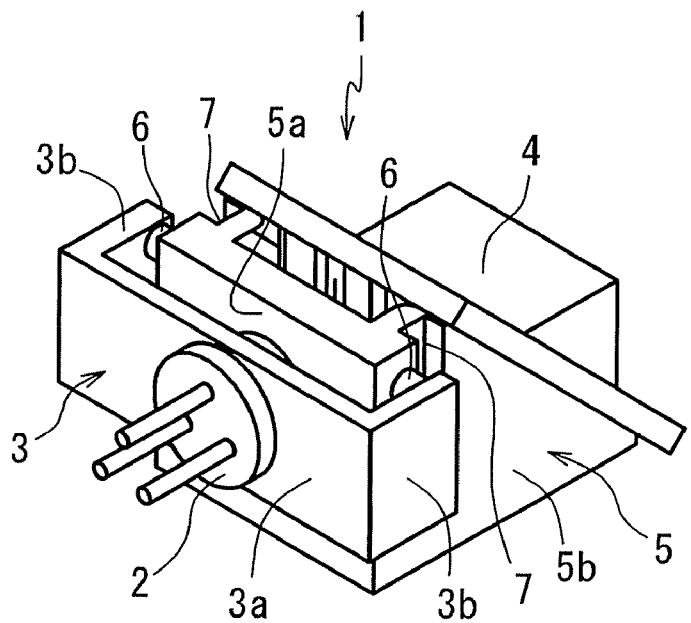
FIG. 1 is a perspective view of a laser source unit in accordance with a first embodiment of the invention.
Figure 2:
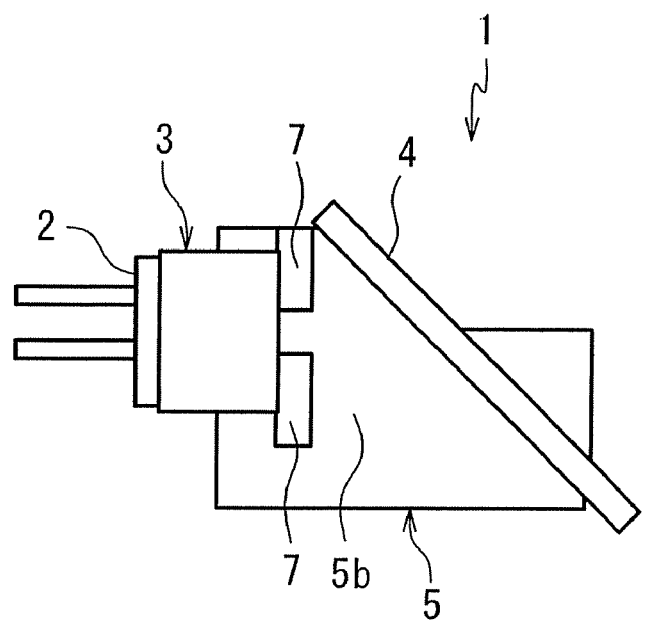
FIG. 2 is a side view of the laser source unit of FIG. 1.
Figure 3:
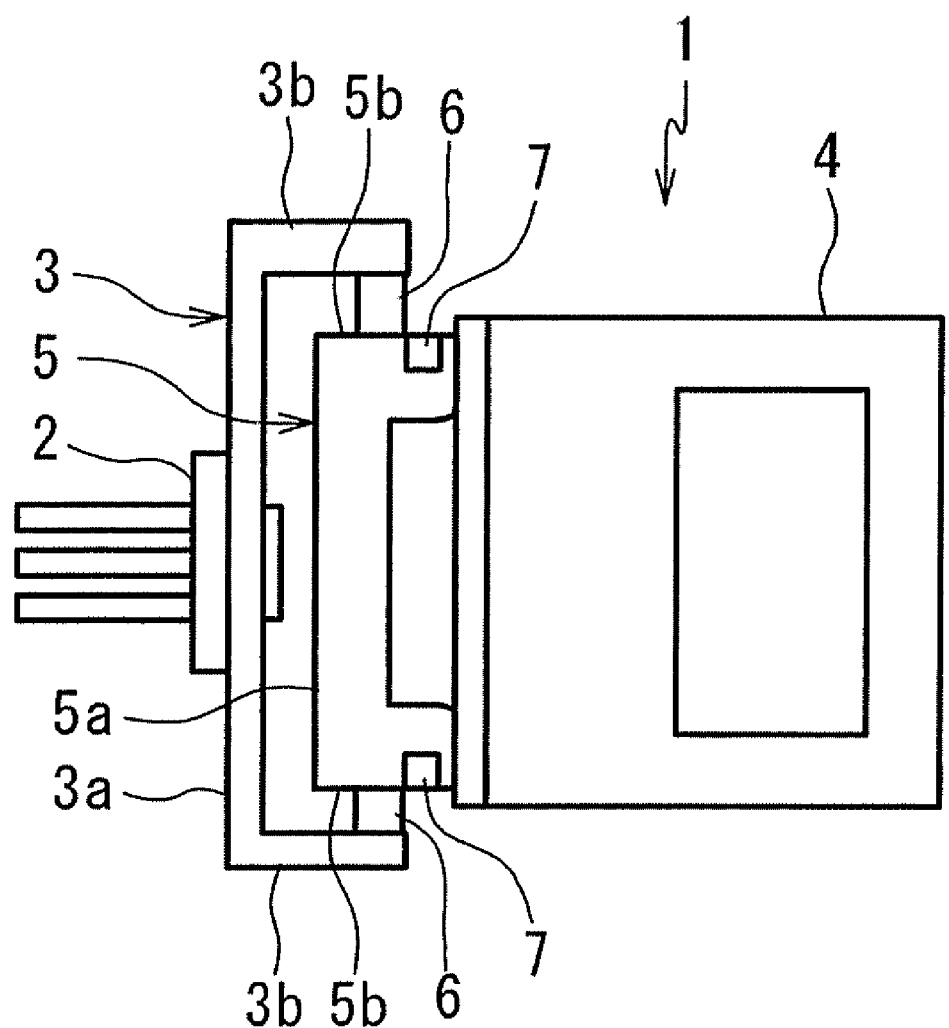
FIG. 3 is a plan view of the laser source unit of FIG. 1.

FIGS. 1, 2 and 3 show a laser source unit 1 that is an optical member in accordance with a first embodiment of the invention. In the laser source unit 1, a support member 3 supporting a laser diode (light emitting member) 2 is fixed by photocurable resin 6 to a housing 5 supporting a diffractive optical element 4.

The diffractive optical element 4 is a light receiving member that receives diffused light emitted from the laser diode 2, that converts the light into parallel rays, and that emits the rays. The housing 5 has a front face 5a provided with an opening that forms an optical path of the laser beam emitted from the laser diode 2, and two opposite side faces 5b that define both side edges of the front face 5a. The support member 3 has a plate-like main body 3a that faces the front face 5a of the housing and that fixes the laser diode 2, and arms 3b that extend from both ends of the main body 3a with clearances formed between the arms and the side faces 5b of the housing 5.

The photocurable resin 6 is deposited so as to form bridges between the side faces 5b of the housing 5 and inside surfaces of the arms 3b and is cured by being irradiated with ultraviolet light (resin curing rays) having a specified wavelength, so that the fixation member 3 and thus the laser diode 2 are fixed to the housing 5.

On the side faces 5b of the housing 5, groove-like recesses 7 are formed so as to adjoin positions where the photocurable resin 6 is deposited.

Figure 4:
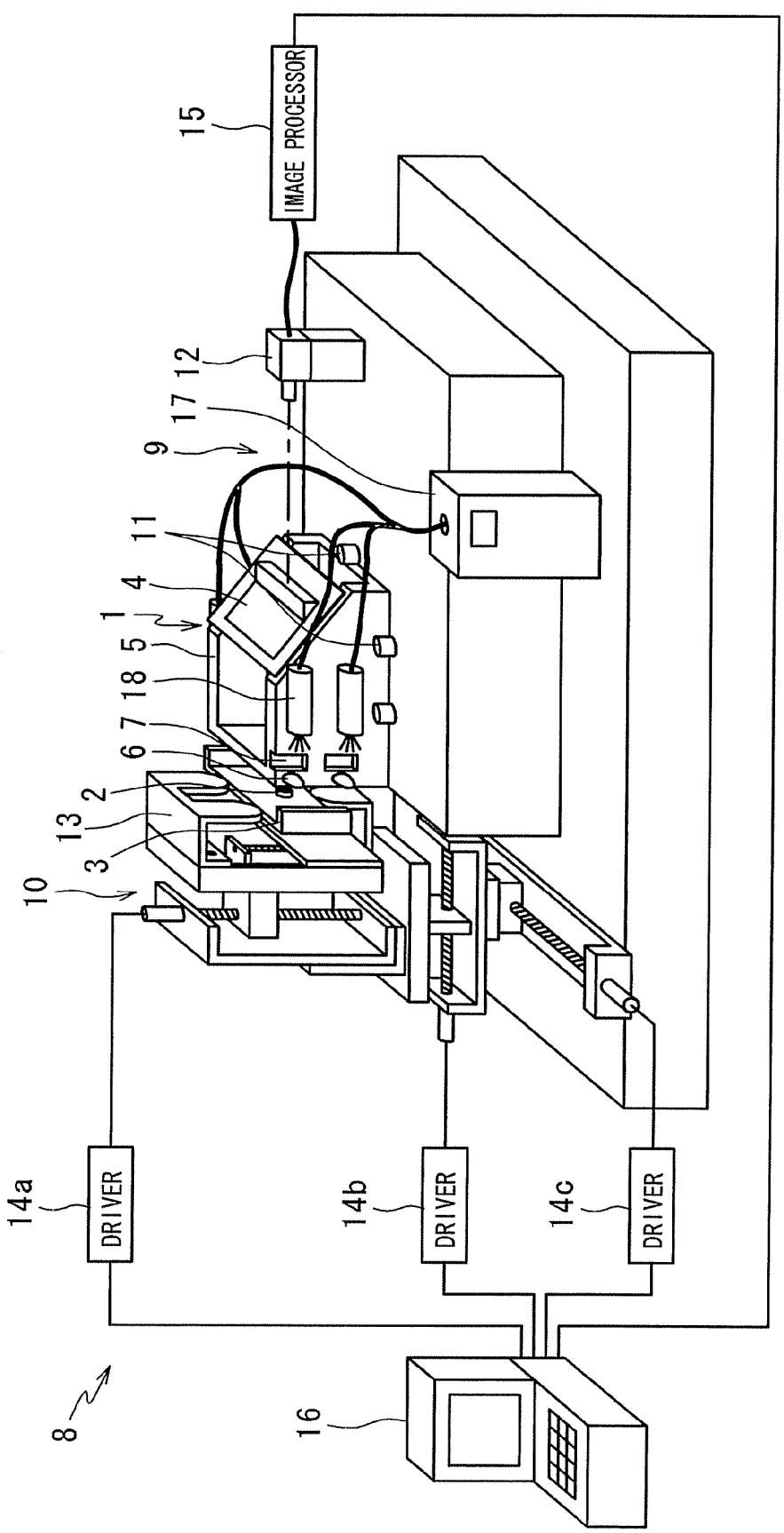
FIG. 4 is a perspective view of an assembling apparatus for the laser source unit of FIG. 1.

FIG. 4 shows an assembling apparatus 8 for the laser source unit 1. The assembling apparatus 8 has a base part 9 on which the housing 5 is loaded in a specified position and an actuator part 10 which supports the fixation member 3 and by which a position of the fixation member 3 can be adjusted with respect to the base part 9. The base part 9 has positioning pins 11 for positioning the housing 5, and a CCD camera 12 for monitoring outputs of the diffractive optical element 4. The actuator part 10 is configured so that a grip head 13 gripping the fixation member 3 can be positioned with respect to the base part 9 by being moved by screws in three axial directions orthogonal to each other.

The assembling apparatus 8 has drivers 14a, 14b, and 14c for driving the actuator part 10 in respective axial directions, an image processor 15 for performing image processing and analysis of outputs from the diffractive optical element 4 which are observed by the CCD camera 12, a computer 16 for controlling the drivers 14a, 14b, and 14c of which operations are to be controlled, on basis of a result of the processing by the image processor, an ultraviolet source unit 17 for producing ultraviolet rays of the specified wavelength for curing the photocurable resin 6, and ultraviolet emission heads 18 that are connected to the ultraviolet source unit 17 by optical fibers and that are placed so as to emit the ultraviolet rays toward the photocurable resin 6.

In assembling of the laser source unit 1 with use of the assembling apparatus 8, initially, the photocurable resin 6 is deposited at specified locations on the side faces 5b of the housing 5 loaded on the base 9. Then the grip head 13 gripping the fixation member 3 in a position away from the housing 5 is brought closer to the housing 5. Thus the arms 3b of the fixation member 3 are moved so as to face the side faces 5b of the housing 5. In the movement, the photocurable resin 6 adheres onto the arms 3b and thus clearances between the arms 3b and the side faces 5b are bridged by the photocurable resin 6.

In a state in which the clearances between the fixation member 3 and the housing 5 are bridged by the photocurable resin 6, the laser diode 2 is supplied with an electric power and fine adjustment of the position of the fixation member 3, that is, that of the laser diode 2 is performed by the actuator part 10 so that the CCD camera 12 can observe the emission of desired parallel rays from the diffractive optical element 4. Once the laser diode 2 is set in an adequate position, the photocurable resin 6 is cured by the ultraviolet rays emitted from the ultraviolet emission heads 18.

Figure 5:
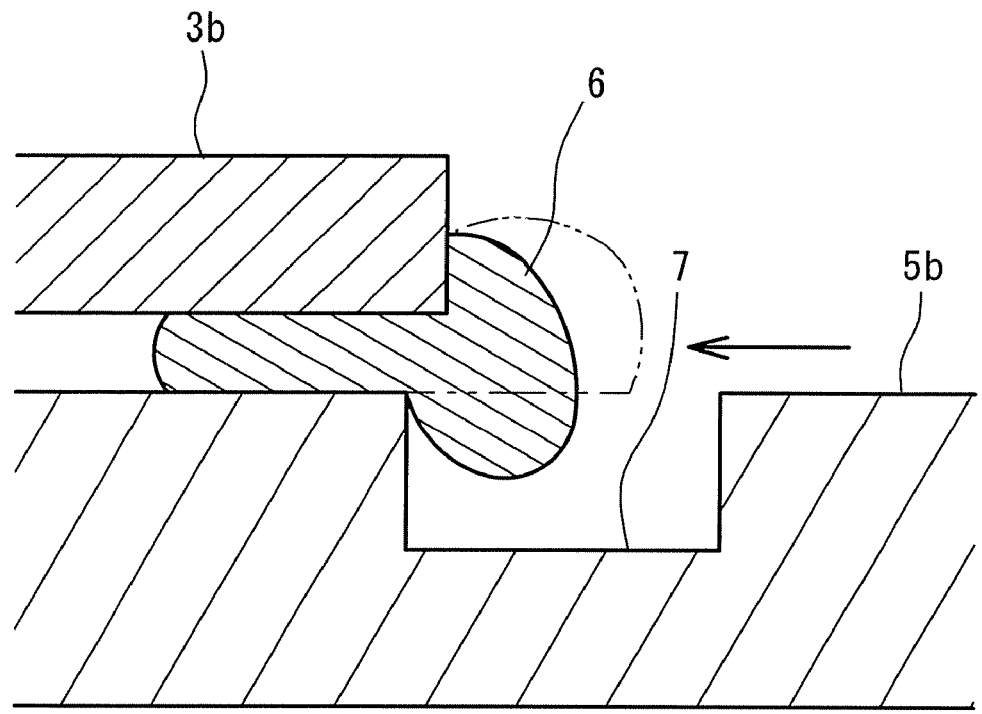
FIG. 5 is a detailed sectional view of photocurable resin in the laser source unit of FIG. 1.

FIG. 5 shows a sectional shape of the photocurable resin 6 in a state in which the laser diode 2 has been positioned. Initially, the photocurable resin 6 is preferably deposited on the side faces 5b so as to have heights larger than a difference between a distance between the arms 3b (distance between the inside surfaces) of the fixation member 3 and a distance between the side faces 5b of the housing 5. Thus top portions of the photocurable resin 6 come into contact with the arms 3b without fail even if the grip position of the fixation member 3 is deviated. The photocurable resin 6 that has been deposited so as to have heights exceeding those of the inside surfaces of the arms 3 adheres to end faces of the arms 3b.

When the arms 3b of the fixation member 3 are advanced along the side faces 5b of the housing 5 or when the arms 3b are thereafter brought closer to the side faces 5b for the fine adjustment, extra photocurable resin 6 intrudes into the recesses 7 as shown. That is, the recesses 7 receive portions of the extra photocurable resin 6, so that spreads of the photocurable resin 6 along the side faces 5b can be reduced. In the drawing, a spread of the photocurable resin 6 on condition that the recess 7 is lacking is shown by a two-dot chain line.

As shown by an arrow in the drawing, ultraviolet rays are applied from a direction of the recess 7 along the side faces 5b onto the photocurable resin 6 between the arms 3b and the side faces 5b. The reception of the portions of the photocurable resin 6 in the recesses 7 reduces a permeation distance to which the ultraviolet rays have to permeate in order to cure all of the photocurable resin 6 and thus reduces a danger of insufficient curing of the photocurable resin 6. In order that the ultraviolet rays can reliably be cast into the clearances between the arms 3b and the side faces 5b, the clearances are preferably set so as to be not less than 0.3 mm after the fine adjustment of the position of the laser diode 2 is done.

The recesses 7 are formed so as to adjoin the positions where the photocurable resin 6 is deposited and so as to be opposed to the main body 3a of the fixation member 3 with regard to the positions, and the recesses 7 open outward so that the ultraviolet rays can be cast into insides thereof even after the fixation member 3 is mounted on the housing 5. Thus the photocurable resin 6 received in the recesses 7 can completely be cured by being permeated and irradiated overall with the ultraviolet rays.

Figure 6:
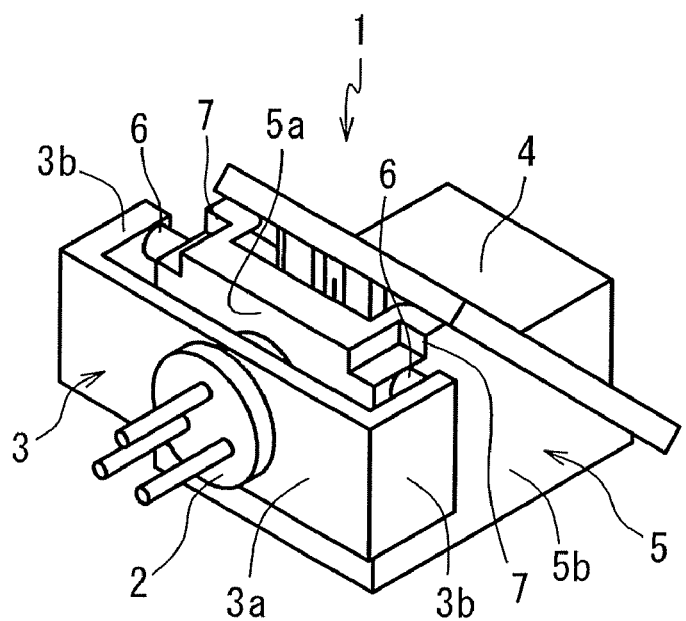
FIG. 6 is a perspective view of a laser source unit in accordance with a second embodiment of the invention.
Figure 7:
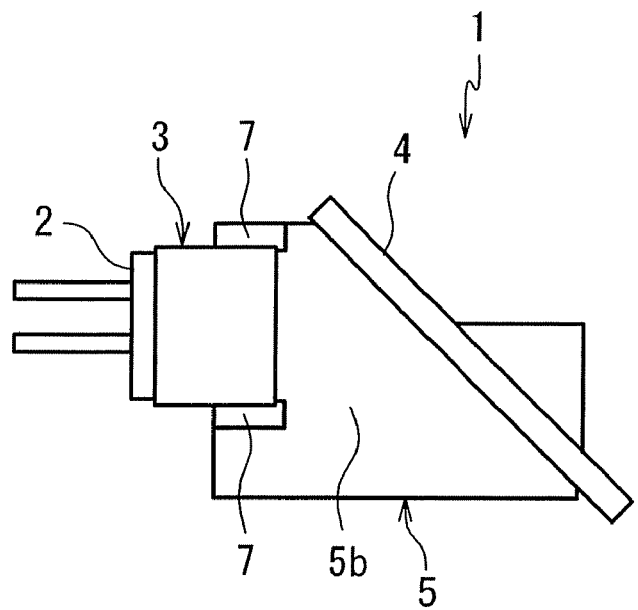
FIG. 7 is a side view of the laser source unit of FIG. 6.

As in a second embodiment of the invention shown in FIGS. 6 and 7, recesses 7 may be provided on upper and lower outside of and adjacent to positions where photocurable resin 6 is deposited on side faces 5b of a housing 5, that is, on both (upper and lower) sides of extending arms 3b of a fixation member 3. In this configuration, ultraviolet emission heads 18 are placed so as to vertically face each other, and the photocurable resin 6 is thereby cured. In description of the embodiment and later, the same elements as those described formerly are designated by the same reference characters and overlapping description is omitted.

Figure 8:
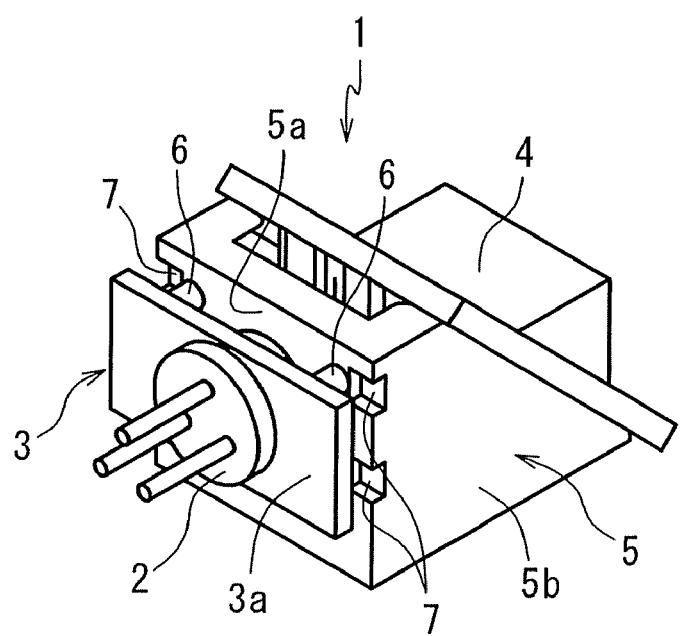
FIG. 8 is a perspective view of a laser source unit in accordance with a third embodiment of the invention.

As in a third embodiment of the invention shown in FIG. 8, photocurable resin 6 may be deposited on a front face 5a of a housing 5, and recesses 7 may be formed in positions adjoining the photocurable resin 6 on the front face 5a.

Figure 9:
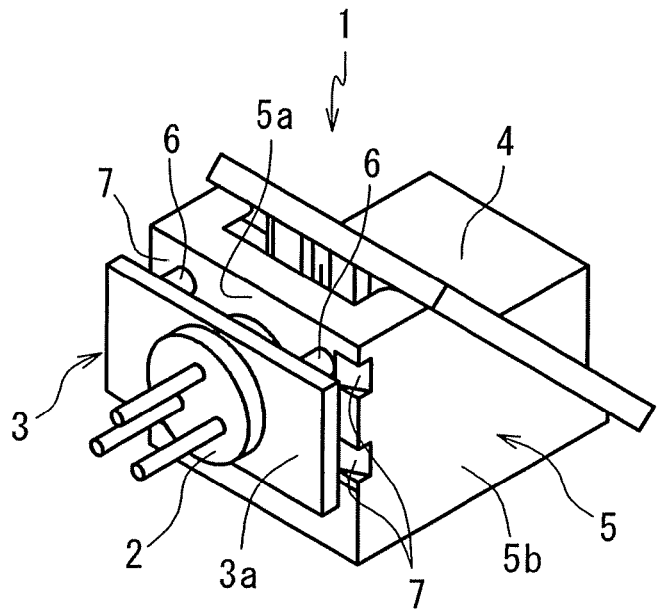
FIG. 9 is a perspective view of a laser source unit in accordance with a fourth embodiment of the invention.
Figure 10:
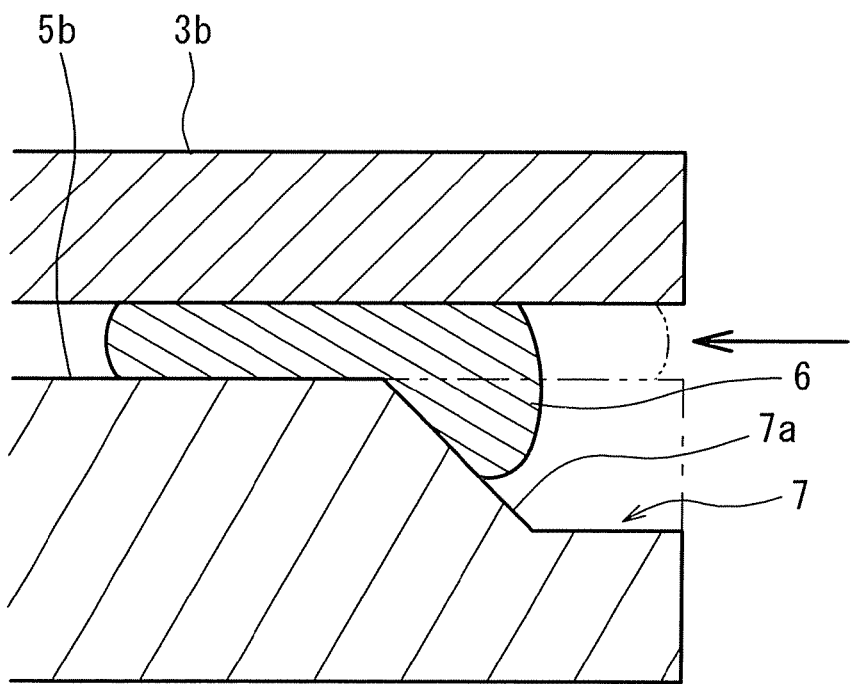
FIG. 10 is a detailed sectional view of photocurable resin in the laser source unit of FIG. 9.

As in a fourth embodiment of the invention shown in FIG. 9, side walls 7a of recesses 7 adjoining positions where photocurable resin 6 is deposited may be slanted so that depths of the recesses 7 gradually increase with distances from the photocurable resin 6. In this configuration, as shown in FIG. 10, wettability of the photocurable resin 6 with respect to the side walls 7a makes it possible to smoothly guide the photocurable resin 6 along the side walls 7a into the recesses 7.

Figure 11:
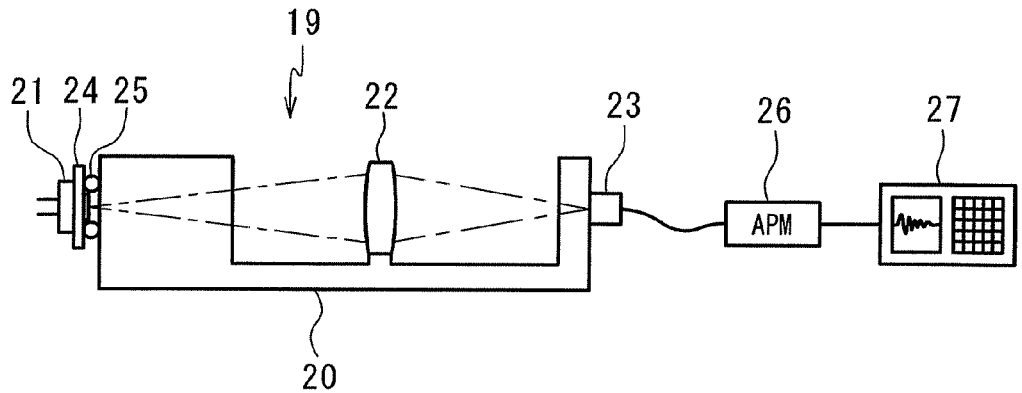
FIG. 11 is a schematic side view of an optical member in accordance with a fifth embodiment of the invention.

FIG. 11 shows a configuration of an optical member 19 in accordance with a fifth embodiment of the invention, in a simplified manner. The optical member 19 in accordance with the embodiment has, on a housing 20, a light emitting member 21, a first light receiving member 22 such as lens or filter for transmitting rays emitted from the light emitting member 21 or for receiving the rays and outputting the rays subjected to optical effects, and a second light receiving member 23 such as photodiode and CCD element for receiving the light outputted from the first light receiving member 22 and converting the light into energy or information.

In the embodiment, a fixation member 24 supporting the light emitting member 21 is positioned with respect to the housing 20 and is fixed by photocurable resin 25. In this process, as shown, the output from the light emitting member 21 may be amplified by an amplifier 26 and may be monitored by an oscilloscope 27, and then a position of the fixation member 24 may be adjusted by manual operation.

Figure 12:
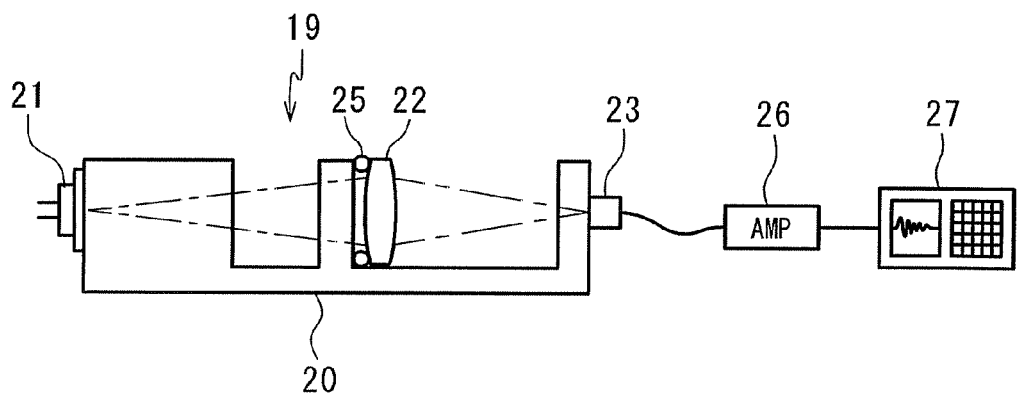
FIG. 12 is a schematic side view of an optical member in accordance with a sixth embodiment of the invention.

In a sixth embodiment of the invention shown in FIG. 12, a first light receiving member 22 is positioned and fixed with respect to a housing 20. In a seventh embodiment of the invention shown in FIG. 13, a second light receiving member 23 is positioned and fixed with respect to a housing 20. As shown in these embodiments, the invention may be applied to positioning and fixation of any member residing in a path of rays with respect to the rays. Besides, it is needless to say that the invention is not limited to a combination of these members shown.

Figure 13:
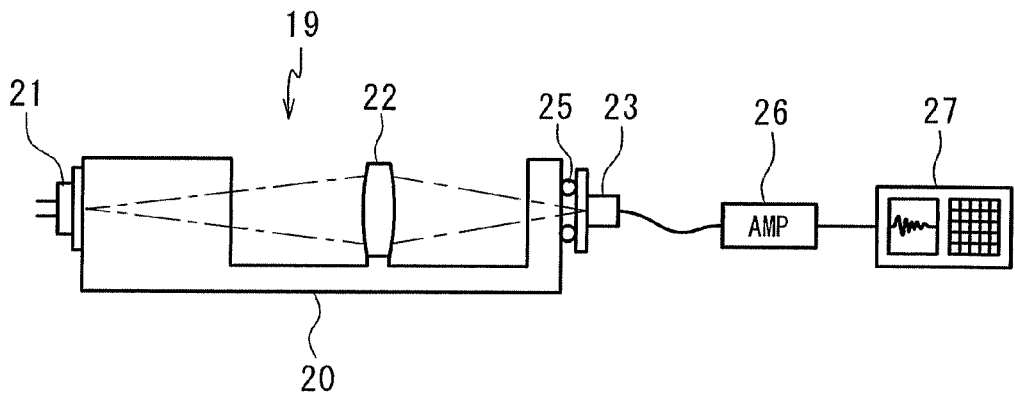
FIG. 13 is a schematic side view of an optical member in accordance with a seventh embodiment of the invention.
Figure 14:
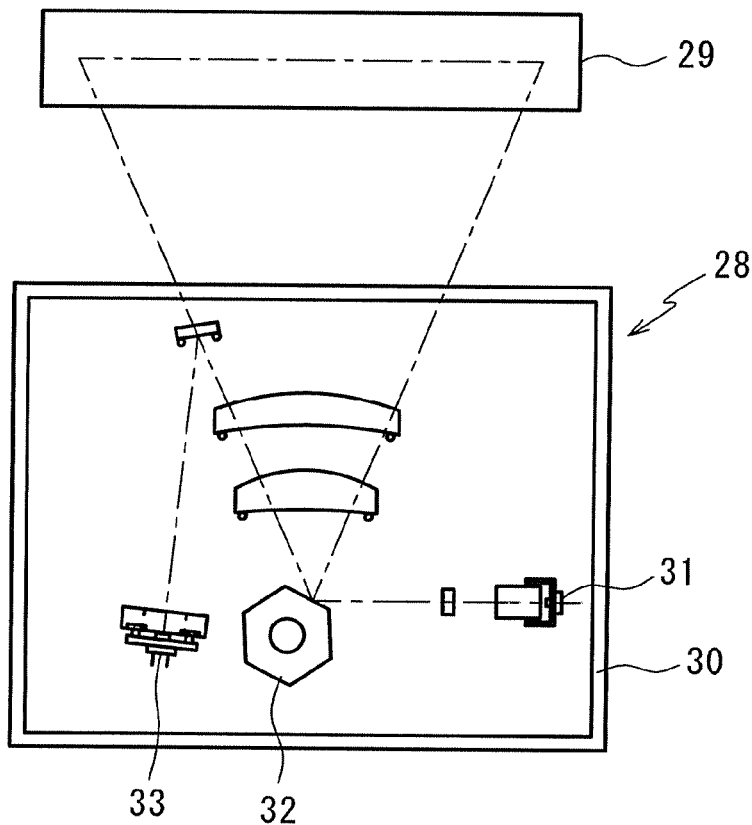
FIG. 14 is a plan view of an exposure device as a concrete example of the optical member of FIG. 13.

FIG. 14 shows an exposure device 28 of an image forming apparatus as a specific example of the seventh embodiment of FIG. 13. The exposure device 28 scans and irradiates a photoreceptor 29 with a laser beam and thereby forms an electrostatic latent image. On a housing 30, in a configuration thereof, there are provided a laser diode (light emitting member) 31 for producing a laser beam with outputs according to scanning image data, a polygon mirror 32 for reflecting while angling the laser beam produced by the laser diode 31 so as to perform scanning with the beam, and a photodiode 33 for receiving the laser beam being at one end of a scanning range in order to detect an origin of scanning position of the laser beam. In the exposure device 28, the photodiode 33 is fixed onto the housing 30 with fine adjustment of a position thereof with respect to the laser beam.

Figure 15:
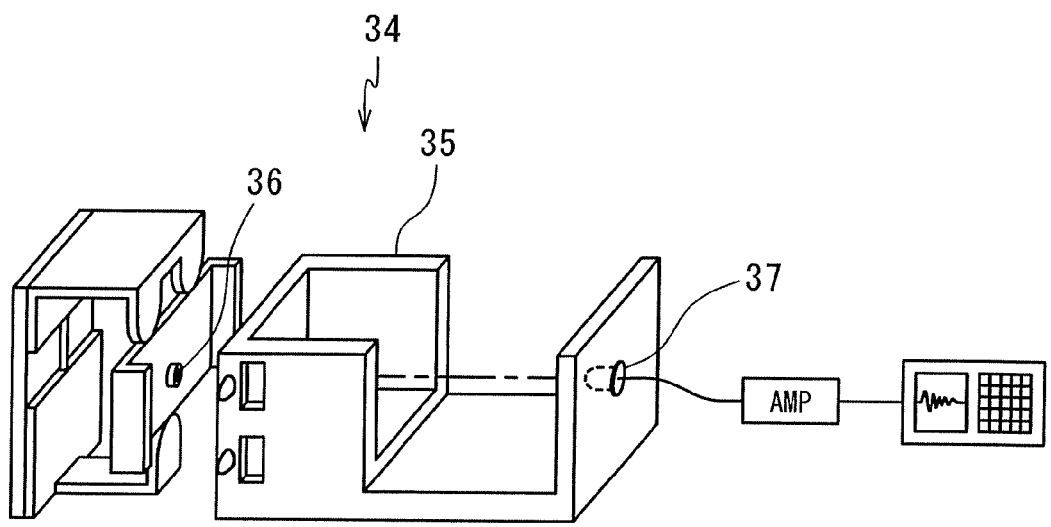
FIG. 15 is a perspective view of an optical member in accordance with an eighth embodiment of the invention.

As in an optical member 34 in accordance with an eighth embodiment of the invention that is shown in FIG. 15 and that is being assembled, the invention can be applied to an optical member that has only a light emitting member 36 and a second light receiving member 37 composed of a light receiving element on a housing 35 and that has no intermediate first light receiving member such as lens.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An optical member comprising:
    a light emitting member for emitting light and a light receiving member for receiving the light emitted from the light emitting member;
    a support member for supporting the light emitting member;
    a housing for supporting the light receiving member;
    a clearance between the support member and the housing, at least a part of the clearance filled with a photocurable resin so as to connect the support member to the housing;
    a recess for collecting excess photocurable resin that is not used to connect the support member to the housing, the recess being formed in one of the support member and the housing, the recess being adjacent to the photocurable resin that is used to connect the support member to the housing, and the recess including at least three distinct internal walls comprising a first internal wall, a second internal wall, and a third internal wall, the first internal wall directly connected to the second and third internal walls; and
    the recess being configured so as to allow casting of light therein to cure the photocurable resin.

2. An optical member as claimed in claim 1, wherein the recess is formed so that a wall of the recess on a side nearest to a position where the photocurable resin is deposited is slanted and so that the depth of the recess gradually increases.

3. An optical member as claimed in claim 1, wherein the housing includes opposing side surfaces that each face in a direction perpendicular to a direction in which light is emitted from the light emitting member, and the recess is exposed on at least one of the side surfaces of the housing.

4. An optical member as claimed in claim 1, wherein the housing includes a top-most surface that faces in a direction perpendicular to a direction in which light is emitted from the light emitting member, an opposing bottom-most surface, two opposing side surfaces connecting the top-most surface and the bottom-most surface, and the recess is exposed on the top-most surface of the housing.

5. A method for manufacturing of an optical member comprising a light emitting member for emitting light, a light receiving member for receiving the light emitted from the light emitting member, a support member and a housing, and a recess being formed in one of the support member and the housing, the method including:
    fixing the light emitting member to the support member so that the support member supports the light emitting member,
    fixing the light receiving member to the housing so that the housing supports the light receiving member,
    providing a clearance between the support member and the housing, and filling at least a part of the clearance with a photocurable resin so as to connect the support member to the housing,
    curing the photocurable resin irradiated with resin curing rays, the recess being configured so as to allow casting of light therein to cure the photocurable resin, wherein
    the recess is adjacent to the photocurable resin so that the recess collects excess photocurable resin that is not used to connect the support member to the housing, and the recess includes at least three distinct internal walls comprising a first internal wall, a second internal wall, and a third internal wall, the first internal wall directly connected of the second and third internal walls.

6. A method for manufacturing of an optical member as claimed in claim 5, wherein positions on the housing where the photocurable resin is deposited are on two outside surfaces thereof opposed to each other, and wherein the support member has a pair of arms that extend in a direction opposed to application of the resin curing rays and that are spaced apart from the outside surface.

7. A method for manufacturing of an optical member as claimed in claim 6, wherein the photocurable resin is deposited on the two outside surfaces so as to have heights not less than a difference between a distance between the pair of arms and a distance between the two outside surfaces, and
    the support member is placed with respect to the housing from the direction opposed to the application of the resin curing rays.

8. A method for manufacturing of an optical member as claimed in claim 6, wherein the arms are extended to positions generally corresponding to ends of a respective recess nearer to the positions where the photocurable resin is deposited.

9. A method for manufacturing of an optical member as claimed in claim 5, wherein the recess is formed so that a wall thereof on a side nearer to the position where the photocurable resin is deposited is slanted and so that a depth thereof gradually increase.

* * * * *